United States Patent
Birdsley et al.

(10) Patent No.: US 6,300,145 B1
(45) Date of Patent: Oct. 9, 2001

(54) ION IMPLANTATION AND LASER ANNEAL TO CREATE N-DOPED STRUCTURES IN SILICON

(75) Inventors: Jeffrey D. Birdsley; Rama R. Goruganthu; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/408,051

(22) Filed: Sep. 29, 1999

(51) Int. Cl.[7] .................................................. H01L 21/66

(52) U.S. Cl. .................. 438/14; 438/15; 438/4; 324/769; 324/768

(58) Field of Search .................... 438/14, 4, 17, 438/15; 324/769, 768

(56) References Cited

U.S. PATENT DOCUMENTS

| | | | | |
|---|---|---|---|---|
| 4,064,620 | * | 12/1977 | Lee et al. | 29/580 |
| 5,185,273 | * | 2/1993 | Jasper | 437/8 |
| 5,688,715 | * | 11/1997 | Sexton et al. | 437/173 |
| 5,904,489 | * | 5/1999 | Khosropour et al. | 438/15 |
| 5,930,588 | * | 7/1999 | Paniccia | 438/16 |
| 5,966,626 | * | 10/1999 | Lo et al. | 438/530 |
| 6,107,108 | * | 8/2000 | Chen et al. | 438/14 |

* cited by examiner

*Primary Examiner*—John F. Niebling
*Assistant Examiner*—Olivia T. Luk

(57) ABSTRACT

The present invention is directed to a method for post-manufacturing analysis of a semiconductor device including a die in a semiconductor device package. According to an example embodiment of the present invention, the package is removed and the die is exposed. Conductive ions are impregnated in a region of the die and a diode is formed. Using the formed diode, target circuitry within the die is analyzed. In this manner, a diode can be formed and used for purposes such as testing or repairing a die.

21 Claims, 2 Drawing Sheets

ION IMPLANTATION AND LASER ANNEAL TO CREATE N-DOPED STRUCTURES IN SILICON

FIELD OF THE INVENTION

The present invention relates generally to semiconductor devices and their fabrication and, more particularly, to semiconductor devices and their manufacture involving analyzing and repair of structure in the devices.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages. A by-product of such high-density and high functionality has been an increase in the number and complexity of the manufacturing processes, as well as an increase in the difficulty of maintaining satisfactory levels of quality control and of providing a cost-effective product using such processes.

As the manufacturing processes for semiconductor devices increase in difficulty, methods for analyzing and repairing the devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Various attributes of individual circuit elements and combinations in a semiconductor device may be tested by exciting selected areas of circuitry in the device. Testing these attributes provides an opportunity for determining such things as the integrity of the semiconductor device or, for defective devices, determining a reason for the defect. Ensuring the integrity and determining defect sources in such devices is important for maintaining proper device function, reliability, and longevity, and for improving the manufacturing process. Unfortunately, access to device circuitry for performing such analysis is difficult, and available testing methods are often impractical or otherwise inefficient. Furthermore, structure within the device is often damaged during analysis, and needs to be repaired in order to function.

SUMMARY OF THE INVENTION

The present invention is exemplified in a number of implementations and applications, some of which are summarized below. The present invention is directed to a new method for post-manufacturing analysis of a semiconductor device including a die in a semiconductor device package. The method improves access to circuitry in the die, provides a manner in which to repair damaged devices, and is particularly useful for repairing damage caused during failure analysis.

According to an example embodiment of the present invention, conductive ions are impregnated in a region of a semiconductor die having a back side opposite circuitry in a circuit side and a diode is formed. The diode is used and the semiconductor die is analyzed.

According to another example embodiment of the present invention, a semiconductor die having a back side opposite circuitry in a circuit side is analyzed. Gallium is implanted in a region in the back side, the region is annealed, and a diode is formed. A FIB is used and an electrical coupling is formed between the diode and a circuit area in the semiconductor die. The circuit area is excited via the diode, and the response of the circuit area to the excitation is analyzed.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
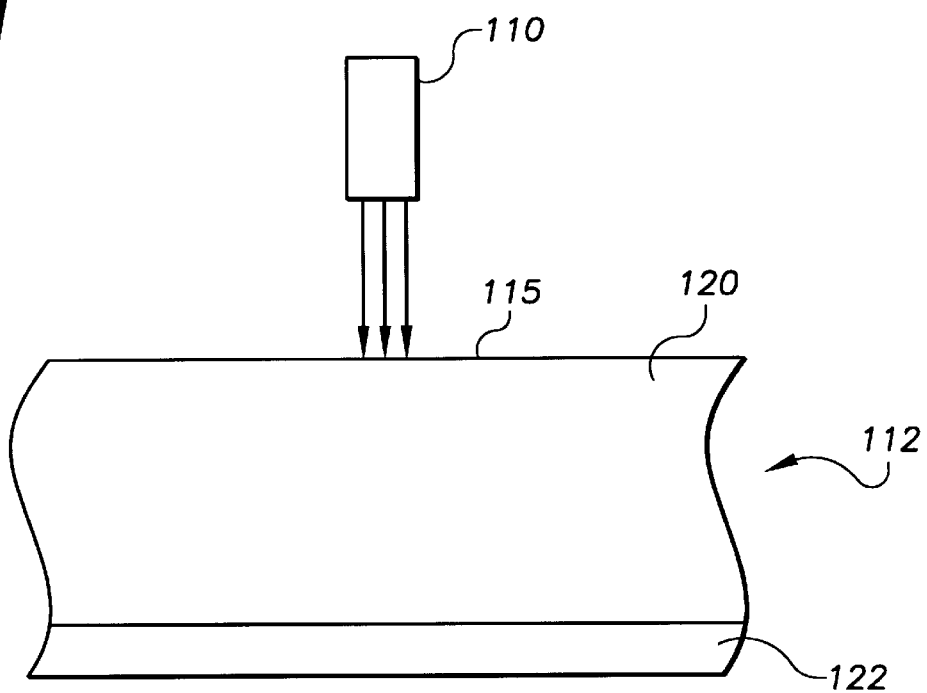
FIG. 1 shows a semiconductor die undergoing ion implantation, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices requiring or benefiting from analysis and repair of device structure. The invention has been found to be particularly suited for flip-chip and other integrated circuit types of semiconductor devices having target circuitry needing analysis or repair. While the present invention is not necessarily limited to such types of semiconductor devices, various aspects of the invention may be appreciated through a discussion of various examples using this context.

The present invention is directed to an innovative method and system for analysis of a semiconductor device having a die in a semiconductor device package. According to an example embodiment of the present invention, the package is removed, the die is exposed, and conductive ions are impregnated in the die. The conductive ions are first implanted, then annealed, and a diode is formed. The diode can subsequently be used for analysis purposes, such as for activating selected circuitry or for enhancing a target area. For instance, the diode may be formed outside of circuitry in the semiconductor die and coupled to the circuitry via metal interconnects. For a detailed explanation of an example method for forming such metal vias, reference may be made to U.S. patent application Ser. No. 09/383,790

(AMDA.288PA), filed on Aug. 26, 1999 and entitled "ARRANGEMENT AND METHOD FOR CHARACTERIZATION OF FIB INSULATOR DEPOSITION." In another instance, the diode may be formed in the circuit and coupled directly to circuitry in the die.

Example uses for the diode include repairing or replacing damaged structures in a semiconductor die, replacing a protection diode, or providing a diode for detection in subsequent processing. Another use for this method of impregnation is for forming a solar cell. For more information regarding the formation of solar cells in integrated circuit devices, reference may be made to U.S. patent application Ser. No. 09/409,302 (AMDA.300PA), filed on Sep. 29, 1999 and entitled "SELECTIVELY ACTIVATABLE SOLAR CELLS FOR INTEGRATED CIRCUIT ANALYSIS."

Figure 2:
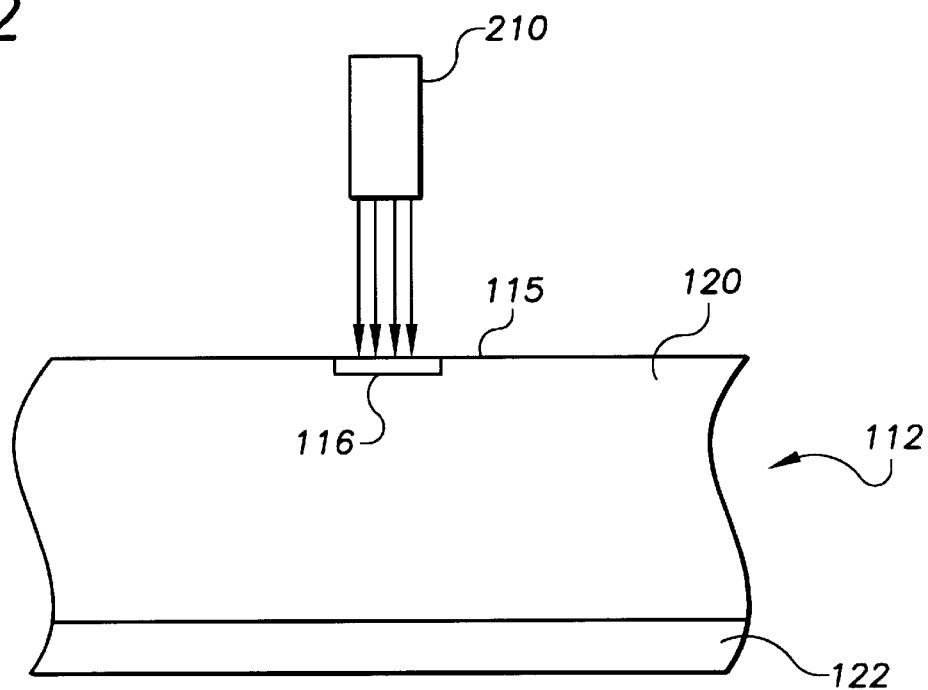
FIG. 2 shows a semiconductor die undergoing annealing subsequent to ion implantation, according to another example embodiment of the present invention.

FIGS. 1–4 show a semiconductor die 112 undergoing diode implantation, according to another example embodiment of the present invention. The semiconductor die 112 has a back side 120 opposite a circuit side 122. Referring now to FIG. 1, a focused ion beam (FIB) generator 110 having a gallium source is used to direct a FIB at a p+ silicon region 115 in the back side 120 of the semiconductor die 112. Gallium ions are implanted in the region 115 via the FIB. The gallium is typically implanted about 0.1 or less microns into the substrate, and changes the p+ silicon region 115 into a n-type region. After the gallium ions are implanted, a laser source 210 is used to direct a laser beam at the region 115 to heat and anneal the region and form a diode 116, as shown in FIG. 2. Annealing the region forces the implanted gallium ions further into the substrate of the die and facilitates the creation of the diode.

Figure 3:
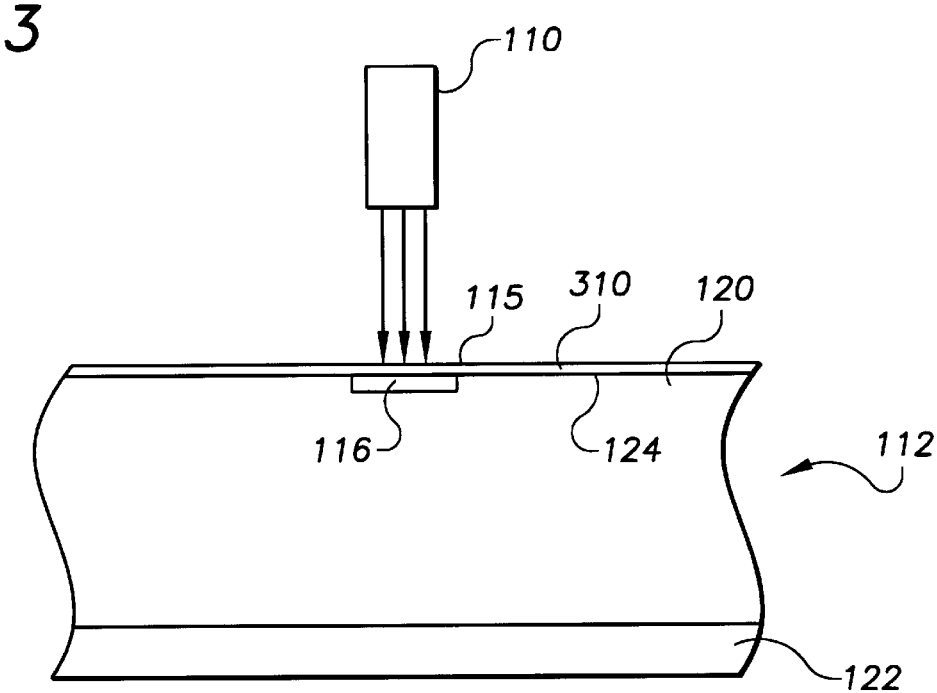
FIG. 3 shows a semiconductor die having and oxide layer formed for insulating and protecting the die substrate according to another example embodiment of the present invention.
Figure 4:
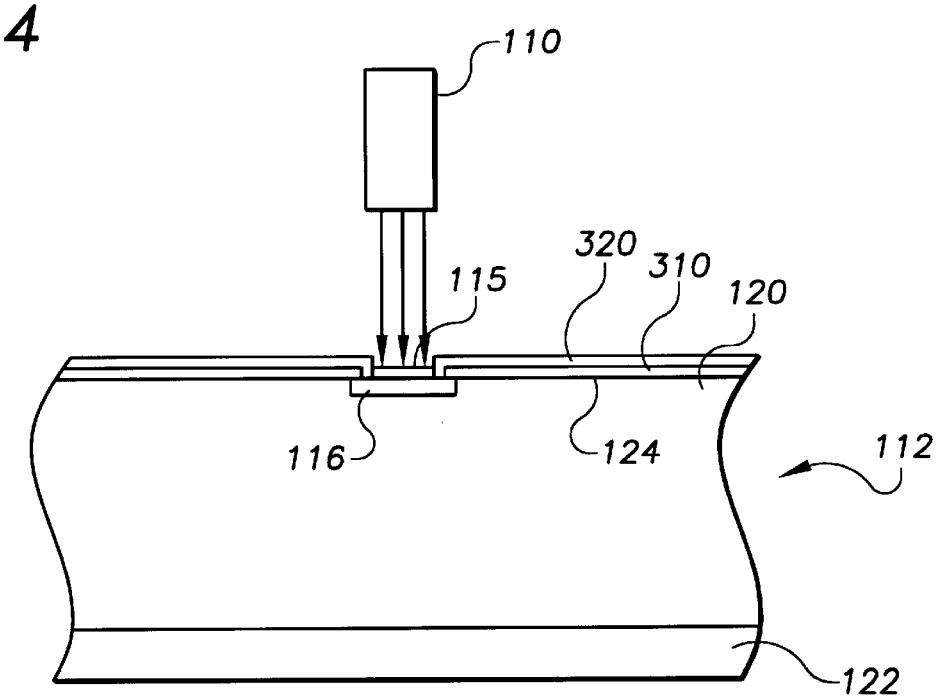
FIG. 4 shows a semiconductor die having circuitry formed for analyzing the die, according to another example embodiment of the present invention.

The semiconductor die can then be processed further to couple the diode 116 to circuitry within the die, as shown in FIG. 3 and FIG. 4. In FIG. 3, the FIB generator 110 is used to deposit an oxide layer 310 at a back side surface 124 adjacent to the diode 116. After the oxide layer 310 is formed, the FIB generator 110 is used to deposit metal 320 and form an interconnect for coupling the diode 116 to other circuitry in the die, as shown in FIG. 4. The connections can be made for purposes such as testing or for replacing a diode either previously removed from the die or otherwise damaged.

Although FIGS. 1–4 show a diode formed near the back side surface of a semiconductor die, the diode can be formed in other regions of the die, such as in the circuit side 122 or buried in the back side 120. The diode can be formed during manufacture of the semiconductor die, or during post-manufacturing testing. For example, a FIB can be used to remove substrate from the back side of a semiconductor die and expose a region at or near device circuitry. Using the methods described herein, a device such as a diode can be formed and coupled to circuitry.

The formation of such a diode is useful for various testing applications. For instance, once the interconnects 320 are coupled to circuitry in the die, die can be placed in a testing arrangement having a power source. The die is powered and the diode operated to selectively activate regions in the circuit to which the diode is coupled, and a response to the selective activation can be detected. This allows an operator to turn on or turn off portions of the circuitry in the semiconductor die.

The present invention is also useful for directly replacing diodes damaged or removed in other testing applications, which makes destructive testing applications more useful because the destructive aspect can be corrected. The diode can be implanted within circuitry in the semiconductor die and coupled directly to the circuitry. In addition, the present invention provides for the replacement of damaged or removed diodes without accessing the area in which the diode was located. Specifically, the new implanted diode can be located outside of the circuit, such as near the back side surface 124 as shown in FIGS. 3 and 4, and coupled to the circuit via the formed metal interconnect 320.

In another repair application, and according to another example embodiment of the present invention, substrate is removed from a back side of a semiconductor die having a circuit side opposite the back side, and an exposed region is formed. Silicon is deposited in the exposed region using a process such as amorphous silicon ion beam deposition with $SiH_2Cl_2$. The exposed region is then annealed, and the silicon is melted and subsequently re-crystallized. Gallium is then implanted in the annealed silicon region, the region is annealed, and a diode is formed. The gallium can be implanted using a device such as a FIB generator, and both the silicon and the gallium can be annealed using a laser device. The formed diode can be used to repair regions in a semiconductor die, such as an n-well region, and may also be coupled to circuitry within the die and used in applications such as forming a solar cell or other devices.

While the present invention has been described with reference to several particular example embodiments, those skilled in the art will recognize that many changes may be made thereto without departing from the spirit and scope of the present invention, which is set forth in the following claims.

What is claimed is:

1. A method for post-manufacturing analysis of a semiconductor device including a die in a semiconductor device package, the method comprising:

after the die is manufactured, impregnating conductive ions in a region of the die and forming a diode within the die; and using the formed p-n junction to analyze target circuitry in the die.

2. A method for post-manufacturing analysis of a semiconductor device, according to claim 1, wherein the conductive ions include Gallium ions.

3. A method for post-manufacturing analysis of a semiconductor device, according to claim 1, wherein impregnating conductive ions comprises:

implanting conductive ions in a region of the die; and annealing the region and forming a diode.

4. A method for post-manufacturing analysis of a semiconductor device, according to claim 3, wherein the conductive ions are implanted about 0.5 microns into the substrate.

5. A method for post-manufacturing analysis of a semiconductor device, according to claim 1, wherein impregnating conductive ions in a region of the die includes using a focused ion beam (FIB).

6. A method for post-manufacturing analysis of a semiconductor device, according to claim 3, wherein annealing the region and forming a p-n junction includes driving the implanted conductive ions into the substrate.

7. A method for post-manufacturing analysis of a semiconductor device, according to claim 1, wherein impregnating conductive ions in a region of the die includes making p-type substrate into n-type substrate in the impregnated region.

8. A method for post-manufacturing analysis of a semiconductor device, according to claim 1, wherein the semiconductor device has circuitry in a circuit side opposite a back side, further comprising coupling the p-n junction to circuitry in the die.

9. A method for post-manufacturing analysis of a semiconductor device, according to claim 8, wherein the p-n junction is formed at the circuitry.

10. A method for post-manufacturing analysis of a semiconductor device, according to claim 8, wherein the p-n junction is formed outside of the circuitry and in the back side of the die.

11. A method for post-manufacturing analysis of a semiconductor device, according to claim 1, wherein the p-n junction is formed to repair the die.

12. A method for post-manufacturing analysis of a semiconductor device, according to claim 11, wherein the p-n junction is formed to repair the die subsequent to testing the die.

13. A method for post-manufacturing analysis of a semiconductor device, according to claim 3, wherein annealing the region and forming a p-n junction include using a laser.

14. A method for post-manufacturing analysis of a semiconductor die having a back side opposite circuitry in a circuit side, the method comprising:

after the die is manufactured, implanting gallium in a region in the back side;

annealing the region and forming a diode;

using a FIB and forming an electrical coupling between the diode and a circuit area in the semiconductor die;

exciting a circuit area in the semiconductor die via the diode; and analyzing the response of the circuit area to the excitation.

15. A method for post-manufacturing analysis of a semiconductor die, according to claim 14, wherein exciting a circuit area in the semiconductor die via the diode includes selectively enhancing target circuitry in the die.

16. A method for post-manufacturing analysis of a semiconductor die, according to claim 14, wherein using a FIB and forming an electrical coupling comprises:

forming an oxide layer; and forming interconnects from the diode to a circuit area.

17. A system for forming structure for post-manufacturing analysis of a semiconductor die, the system comprising:

a FIB adapted to remove substrate from the semiconductor die after the die is manufactured and to then form an exposed region;

a silicon-based FIB adapted to deposit silicon in the exposed region;

a laser device adapted to anneal the exposed region;

a FIB adapted to impregnate conductive ions in the annealed silicon and form a pn junction; and means for analyzing the die having the impregnating conductive ions.

18. A system for forming structure for post-manufacturing analysis of a semiconductor die, according to claim 17, wherein the silicon-based FIB is adapted to use $SiH_2Cl_2$ and deposit amorphous silicon.

19. A system for forming structure for post-manufacturing analysis of a semiconductor die, according to claim 17, further comprising a testing arrangement adapted to analyze the semiconductor device in response to the formed pn junction.

20. A system for forming structure for post-manufacturing analysis of a semiconductor die, according to claim 17, further comprising a FIB adapted to deposit metal and electrically couple the diode to a circuit area in the die.

21. A method for post-manufacturing analysis of a semiconductor device including a die in a semiconductor device package, the method comprising:

means for impregnating conductive ions in a region of the die and forming a pn junction within the die after the die is manufactured; and means for using the formed p-n junction to analyze target circuitry in the die.

* * * * *

UNITED STATES PATENT AND TRADEMARK OFFICE
CERTIFICATE OF CORRECTION

PATENT NO. : 6,300,145 B1
DATED : October 9, 2001
INVENTOR(S) : Birdsley et al.

It is certified that error appears in the above-identified patent and that said Letters Patent is hereby corrected as shown below:

<u>Column 5,</u>
Line 20, "include" should read -- includes --.
Line 29, after "in the", please delete ".".

Signed and Sealed this

Twenty-sixth Day of March, 2002

*Attest:*

*Attesting Officer*

JAMES E. ROGAN
*Director of the United States Patent and Trademark Office*